(12) United States Patent
Cherney et al.

(10) Patent No.: US 7,808,775 B2
(45) Date of Patent: Oct. 5, 2010

(54) MODULAR POWER DISTRIBUTION SYSTEM HAVING A SEALING ARRANGEMENT FOR USE IN A WORK MACHINE

(75) Inventors: Mark J. Cherney, Potosi, WI (US); Andrew D. Wieland, Fargo, ND (US)

(73) Assignee: Deere & Company, Moline, IL (US)

( * ) Notice: Subject to any disclaimer, the term of this patent is extended or adjusted under 35 U.S.C. 154(b) by 272 days.

(21) Appl. No.: 12/044,480

(22) Filed: Mar. 7, 2008

(65) Prior Publication Data
US 2009/0225500 A1 Sep. 10, 2009

(51) Int. Cl.
*H02B 1/26* (2006.01)
(52) U.S. Cl. .................. 361/624; 361/637; 361/640; 439/272; 174/70 B
(58) Field of Classification Search ............ 361/624, 361/637, 640, 648, 650, 657; 174/50.52, 174/70 B, 99 B, 133 B, 149 B; 439/89, 212–213, 439/271–273, 548, 556, 559
See application file for complete search history.

(56) References Cited

U.S. PATENT DOCUMENTS

| 3,264,403 A | * | 8/1966 | Erdle ................. 174/72 B |
| 3,925,710 A | | 12/1975 | Ebert |
| 4,960,391 A | * | 10/1990 | Beinhaur et al. ............ 439/559 |
| 5,266,054 A | * | 11/1993 | Duncan et al. ......... 439/620.12 |
| 5,901,033 A | | 5/1999 | Crawford et al. |
| 5,949,641 A | | 9/1999 | Walker et al. |
| 5,982,610 A | | 11/1999 | Crawford et al. |
| 6,075,698 A | * | 6/2000 | Hogan et al. ............... 361/695 |
| 6,219,258 B1 | * | 4/2001 | Denzene et al. ............ 361/816 |
| 6,244,876 B1 | * | 6/2001 | Saka ........................ 439/76.2 |
| 6,339,192 B1 | * | 1/2002 | Hashimoto ................ 174/72 B |
| 6,473,294 B1 | * | 10/2002 | Maier ........................ 361/611 |
| 6,552,274 B1 | * | 4/2003 | Nakamura ................. 174/151 |
| 6,629,365 B2 | * | 10/2003 | Denzene et al. ............. 29/841 |

(Continued)

FOREIGN PATENT DOCUMENTS

JP 2003110273 A * 4/2003

OTHER PUBLICATIONS

Raychem Corporation, GelTek Sealant Strip, Oct. 1995.*

(Continued)

*Primary Examiner*—Jayprakash N Gandhi
*Assistant Examiner*—Robert J Hoffberg
(74) *Attorney, Agent, or Firm*—Taylor IP, P.C.

(57) ABSTRACT

A power distribution system for a work machine includes a power electronics module having a set of power connectors to receive electrical power. A module rack has an opening for slidably receiving the power electronics module. A power bus assembly is mounted to the module rack. The power bus assembly has a set of power bus connectors located to be mechanically engaged by the set of power connectors of the power electronics module when the power electronics module is installed in the module rack. A gasket is interposed in a sealing arrangement between the power electronics module and the power bus assembly. The gasket is configured to extend completely around all power connectors of the set of power connectors and is configured to extend completely around each individual power connector of the set of power connectors.

18 Claims, 7 Drawing Sheets

U.S. PATENT DOCUMENTS

| | | | |
|---|---|---|---|
| 6,674,006 B1 * | 1/2004 | Linehan et al. | 174/72 B |
| 7,417,848 B2 * | 8/2008 | Bergmann et al. | 361/624 |
| 7,525,809 B2 * | 4/2009 | Bergmann et al. | 361/752 |
| 2003/0011969 A1 | 1/2003 | Doan et al. | |
| 2006/0082970 A1 | 4/2006 | Walz et al. | |

OTHER PUBLICATIONS

Amphenol Corporation, Amphenol High Frequency Contacts, Catalog SL-400, Oct. 2007.*

US 7,258,584, 8/2007, Korczynski et al. (withdrawn).

Methode Network Bus Products web page, pp. 1 and 2; Capabilities, pp. 1 and 2; Featured Products, p. 1; About Methode, pp. 1 and 2: available at: http://www.methodenetworkbus.com/featured_PowerRail.aspx.

Power Distribution Solutions, brochure, pp. 1-24.

Power Rail 200 Amp Fact Sheet, brochure, pp. 1-2.

Power Distribution Solutions Power Rail 200A, brochure, pp. 1-4.

Power Distribution Solutions Power Rail 500A, brochure, pp. 1-4.

Power Distribution Solutions Power Rail 1000A, brochure, pp. 1-4.

Power Distribution Solutions Power Rail 2000A, brochure, pp. 1-4.

Methode Network Bus Products web page, pp. 1 and 2; Capabilities, pp. 1 and 2; Featured Products, p. 1; About Methode, pp. 1 and 2: available at: http://www.methodenetworkbus.com/featured_PowerRail.aspx, retrieved on May 27, 2008.

* cited by examiner

MODULAR POWER DISTRIBUTION SYSTEM HAVING A SEALING ARRANGEMENT FOR USE IN A WORK MACHINE

FIELD OF THE INVENTION

The present invention relates generally to work machines, and more particularly, to a modular power distribution system having a sealing arrangement for use in a work machine.

BACKGROUND OF THE INVENTION

A typical electric drive propulsion system consists of a generator and corresponding power electronics which provide power on a voltage bus. The motor(s) and their corresponding power electronics take power off the bus to drive the traction motors. The bus is typically of high potential, e.g., 200 to 1000 volts (V), and may be subject to a number of possible problems when operated in a dirty or wet environment that may be experienced by a work machine, e.g., mobile agricultural machines, mobile construction machines, mobile transportation vehicles, etc. Those problems may include, for example, bus to bus, bus to ground, phase to phase, and phase to ground short circuits. Furthermore, some existing bus systems are difficult to service because of the orientation and quantity of connections. In addition, many existing bus systems cause the power electronics to be largely isolated from each other resulting in a high inductance bus, which in turn requires each power electronics module to have large filtering capacitance.

What is needed in the art is a modular power distribution system having a sealing arrangement for use in a work machine, and which may be used with a power bus assembly with low inductance.

SUMMARY OF THE INVENTION

The invention, in one form thereof, is directed to a power distribution system for a work machine. The power distribution system includes a power electronics module having a set of power connectors to receive electrical power. A module rack has an opening for slidably receiving the power electronics module. A power bus assembly is mounted to the module rack. The power bus assembly has a set of power bus connectors located to be mechanically engaged by the set of power connectors of the power electronics module when the power electronics module is installed in the module rack. A gasket is interposed in a sealing arrangement between the power electronics module and the power bus assembly. The gasket is configured to extend completely around all power connectors of the set of power connectors and is configured to extend completely around each individual power connector of the set of power connectors.

The invention, in another form thereof, is directed to a work machine. The work machine includes an electrical power source, a plurality of traction motors, and a power distribution system coupled between the electrical power source and the plurality of traction motors. The power distribution system includes a plurality of power electronics modules, a module rack and a plurality of gaskets. Each power electronics module of the plurality of power electronics modules has a set of power connectors to receive electrical power. The module rack has a plurality of openings for respectively slidably receiving the plurality of power electronics modules. The power bus assembly is mounted to the module rack. The power bus assembly has a plurality of sets of power bus connectors. Each set of power bus connectors is located to be mechanically engaged by a corresponding set of power connectors of a corresponding power electronics module of the plurality of power electronics modules when the corresponding power electronics module is installed in the module rack. The plurality of gaskets is interposed in a sealing arrangement between the plurality of power electronics modules and the power bus assembly, wherein a corresponding gasket of the plurality of gaskets is configured to extend completely around the corresponding set of power connectors of the corresponding power electronics module and is configured to extend completely around each individual power connector of the corresponding set of power connectors of the corresponding power electronics module.

The invention, in another form thereof, is directed to a power electronics module for a power distribution system. The power electronics module includes a housing containing power electronics, the housing having a panel. A set of power connectors is coupled to the power electronics and is configured to receive electrical power. The housing is configured to expose the set of power connectors through the panel. A gasket is configured to extend completely around the set of power connectors at the panel and is configured to extend completely around each individual power connector of the set of power connectors at the panel.

The invention, in another form thereof, is directed to a power bus assembly for use in a power distribution system. The power bus assembly includes a structural member having a smooth planar surface and having a plurality of openings. A plurality of power bus bars is mounted to the structural member. The plurality of power bus bars are configured to have a plurality of sets of power bus connector blades that extend through the plurality of openings the structural member. The smooth planar surface of the structural member surrounds each set of power bus connector blades of the plurality of sets of power bus connector blades, and surrounds each power bus connector blade of each set of power bus connector blades. A plurality of insulator layers is provided, wherein a portion of the plurality of insulator layers are respectively interposed between adjacent power bus bars of the plurality of power bus bars. An insulator layer of the plurality of insulator layers is interposed between the structural member and the plurality of power bus bars. Each gasket of a plurality of individual gaskets is respectively positioned over a corresponding set of power bus connector blades of the plurality of sets of power bus connector blades. Each gasket of the plurality of individual gaskets is located to engage the smooth planar surface and extend completely around the corresponding set of power bus connector blades, and is located to engage the smooth planar surface and extend completely around each power bus connector blade of the corresponding set of power bus connector blades.

DETAILED DESCRIPTION OF THE INVENTION

Figure 1:
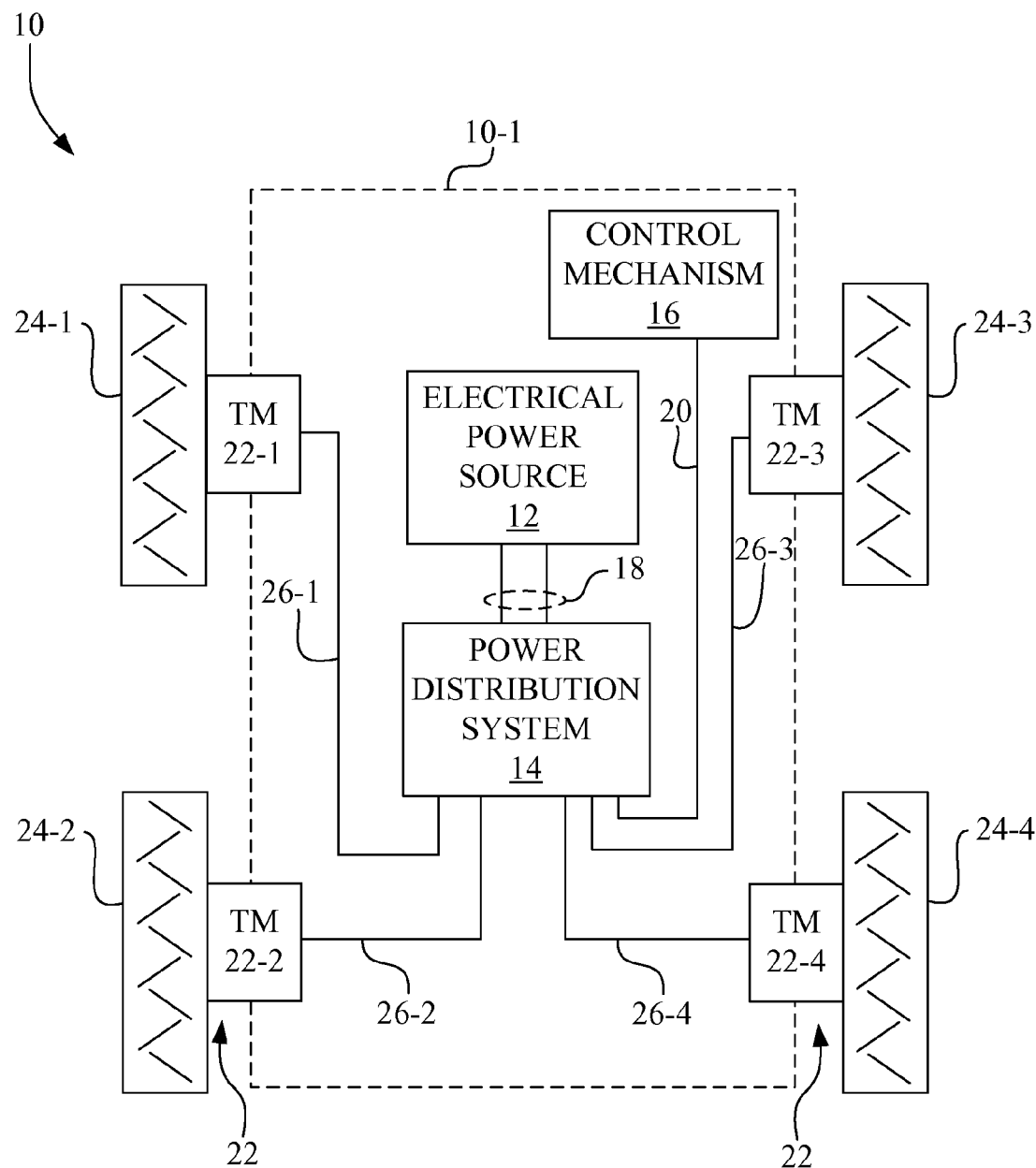
FIG. 1 a diagrammatic representation of a work machine having a power distribution system configured in accordance with an embodiment of the present invention.

Referring now to the drawings, and more particularly to FIG. 1, there is shown a diagrammatic representation of a work machine 10 embodying the present invention.

Work machine 10 includes a frame 10-1 to which an electrical power source 12, a power distribution system 14, and a control mechanism 16 are mechanically mounted. Electrical power source 12 is electrically connected to power distribution system 14 by a power cable 18, which may include multiple electrical cables, which in turn may include one or more electrical conductors. Control mechanism 16 may provide, for example, a plurality of electrical control output signals, such as a ground speed signal, steering output signals, braking output signals, etc., which are supplied to power distribution system 14 via a communication cable 20. A plurality of traction motors (TM) 22, individually identified by element numbers 22-1, 22-2, 22-3 and 22-4, is mounted to frame 10-1, and individually are connected to a corresponding drive wheel 24-1, 24-2, 24-3 and 24-4. Each of the traction motors 22 may be, for example, a brushless DC motor. While the example of FIG. 1 shows work machine 10 having four traction motors 22-1, 22-2, 22-3 and 22-4, those skilled in the art will recognize that work machine 10 may have more or less traction motors, depending on design criteria and/or the intended application.

Electrical power source 12 may be of a variety of configurations, such as for example, a combustion engine/generator arrangement, battery arrangement, fuel cell arrangement, etc., that is configured to provide an electrical output. The electrical output of electrical power source 12 may be, for example, an alternating current (AC) output in single phase or multi-phase, or a direct current (DC) output.

Power distribution system 14 is electrically coupled between the electrical power source 12 and the plurality of traction motors 22. More particularly, in the example of FIG. 1 power distribution system 14 is configured to selectively supply electrical power to each of traction motors 22-1, 22-2, 22-3 and 22-4 via a corresponding power cable 26-1, 26-2, 26-3 and 26-4. Each power cable 26-1, 26-2, 26-3 and 26-4 may include one or more electrical conductors, as shown in FIG. 2.

Figure 2:
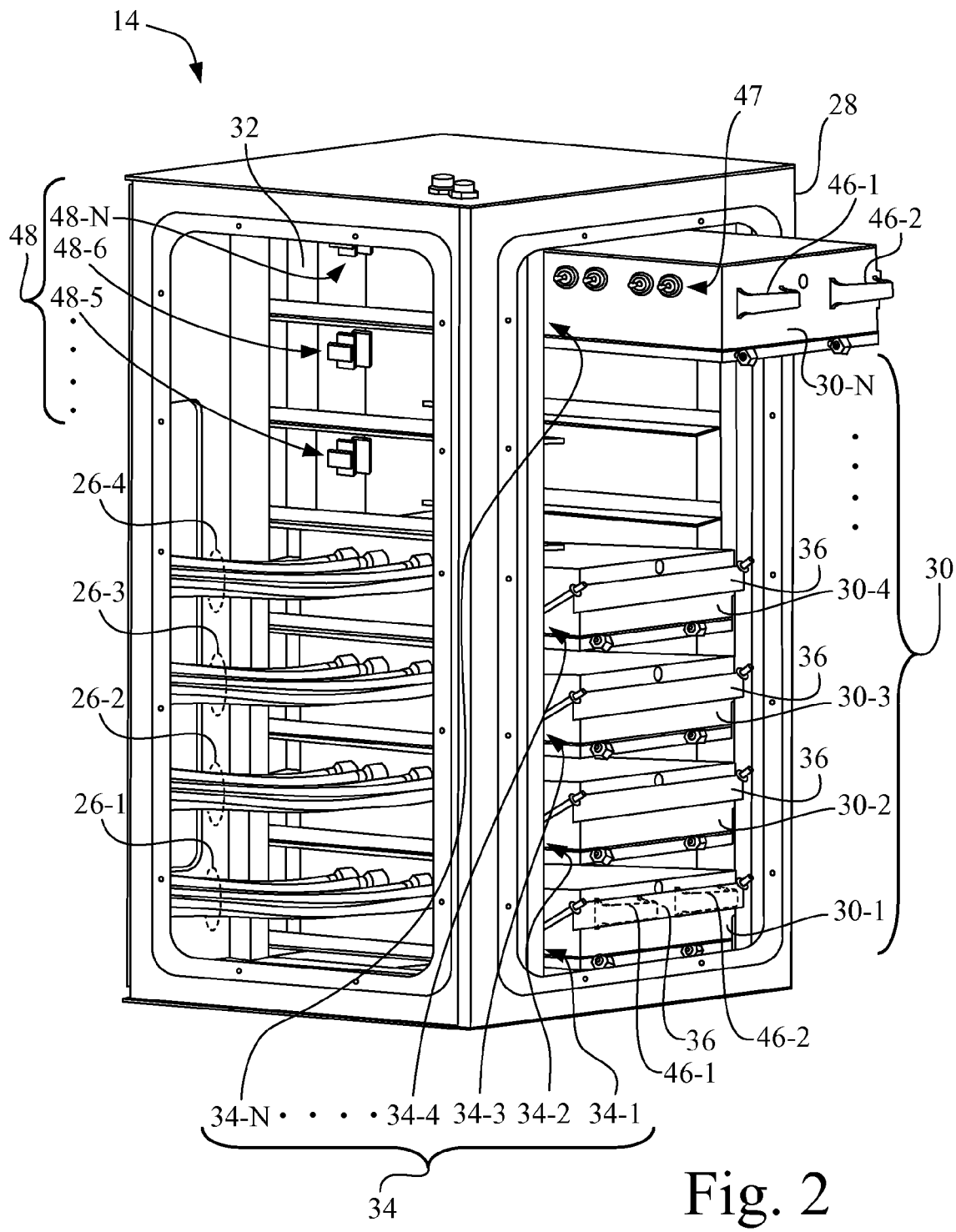
FIG. 2 is a perspective view of the power distribution system of FIG. 1.

Referring to FIG. 2, power distribution system 14 includes a module rack 28, a plurality of power electronics modules 30 and a power bus assembly 32.

Module rack 28 has a plurality of openings 34, e.g., 34-1, 34-2, 34-3, 34-4, . . . 34-N, for respectively slidably receiving the plurality of power electronics modules 30, e.g., 30-1, 30-2, 30-3, 30-4, . . . 30-N, wherein N is a positive integer. Module rack 28 is designed such that the plurality of power electronics modules 30 are located on one side of module rack 28, such that all cooling and electrical connections may be accessed from two sides of module rack 28. Each of the plurality of power electronics modules 30 installed in its respective opening 34-1, 34-2, 34-3, 34-4, . . . 34-N in module rack 28 is held in position by a respective clamping mechanism 36 to securely couple the plurality of power electronics modules 30 to power bus assembly 32. Clamping mechanism 36 may be of a type typically used in battery holding arrangements, and may be configured, for example, as an L-shaped bracket that is engaged by a pair of spaced treaded rods, with nuts that tighten against the bracket.

Power bus assembly 32 is mounted to the module rack 28. Power bus assembly 32 is configured to supply electrical power to the plurality of power electronics modules 30, and each of the plurality of power electronics modules 30 is configured to receive electrical power from power bus assembly 32. Those skilled in the art will recognize that power bus assembly 32 may be adapted for either of AC or DC applications. In the present exemplary embodiment, power bus assembly 32 is configured to supply DC power, and each of the plurality of power electronics modules 30 is configured as a power inverter to take DC power from power bus assembly 32 and supply modulated DC power in the proper timing via the multiple conductors of the respective power cables 26-1, 26-2, 26-3 and 26-4 for use by the brushless DC motors serving as traction motors 22.

Figure 3:
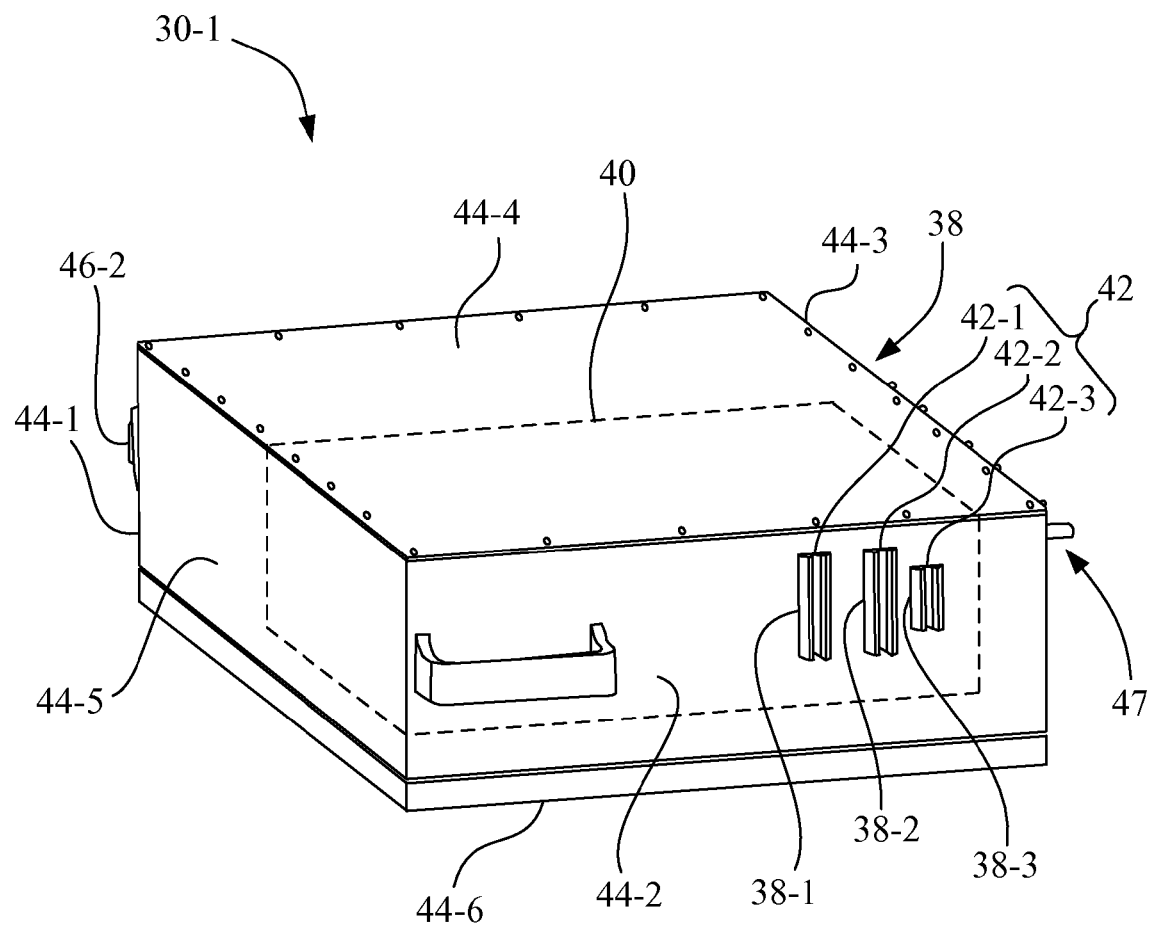
FIG. 3 is a rear perspective view of an exemplary power electronics module configured for use in the power distribution system of FIG. 2.

Referring to FIG. 3, there is shown a rear view of an exemplary power electronics module 30-1, which is representative of each of the plurality of power electronics modules 30. It is to be understood that the discussion that follows with specific reference to power electronics module 30-1 will also apply to the other power electronics modules 30-2, 30-3, 30-4, . . . 30-N, and thus for brevity will not be repeated for each power electronics module.

Power electronics module 30-1 includes a housing 38 containing power electronics 40 (diagrammatically represented by dashed lines). Power electronics 40 include electrical and electronic components configured to accommodate the desired function, which in the present case is that of a power inverter. A set of power connectors 42 are electrically coupled to the power electronics 40.

Referring also to FIG. 2 along with FIG. 3, housing 38 of power electronics module 30-1 is in the form of a sealed box that includes a front panel 44-1, a rear panel 44-2 and a plurality of side panels 44-3, 44-4, 44-5 and 44-6. Front panel 44-1 of each of the power electronics modules 30 includes a pair of handles 46-1, 46-2 that aid a user in installing the module in module rack 28. The pair of handles 46-1, 46-2 are located to be engaged by the respective clamping mechanism 36. Rear panel 44-2 of housing 38 is configured, e.g., with openings 38-1, 38-2, 38-3, to expose the set of power connectors for connection to power bus assembly 32. Side panel 44-3 includes a set of output connectors 47 for connection to the associated power cable, e.g., power cable 26-1.

The set of power connectors 42 of power electronics module 30-1 is configured to receive electrical power from power bus assembly 32. For example, as shown in FIG. 3, the set of power connectors 42 may include a positive connector 42-1, a negative connector 42-2, and one or more auxiliary connectors, such as a ground connector 42-3. Ground connector 42-3, adjacent to negative connector 42-2, may also serve as a mechanical guide device to guide power electronics module 30-1 into its proper position with respect to power bus assembly 32 during installation of power electronics module 30-1 in module rack 28. The mechanical guide device may alternatively be separate from, but adjacent to, the set of power connectors 42. The set of power connectors 42 may be, for example, in the form of a set of electrically conductive receiving slots, i.e., female connectors.

Figure 4:
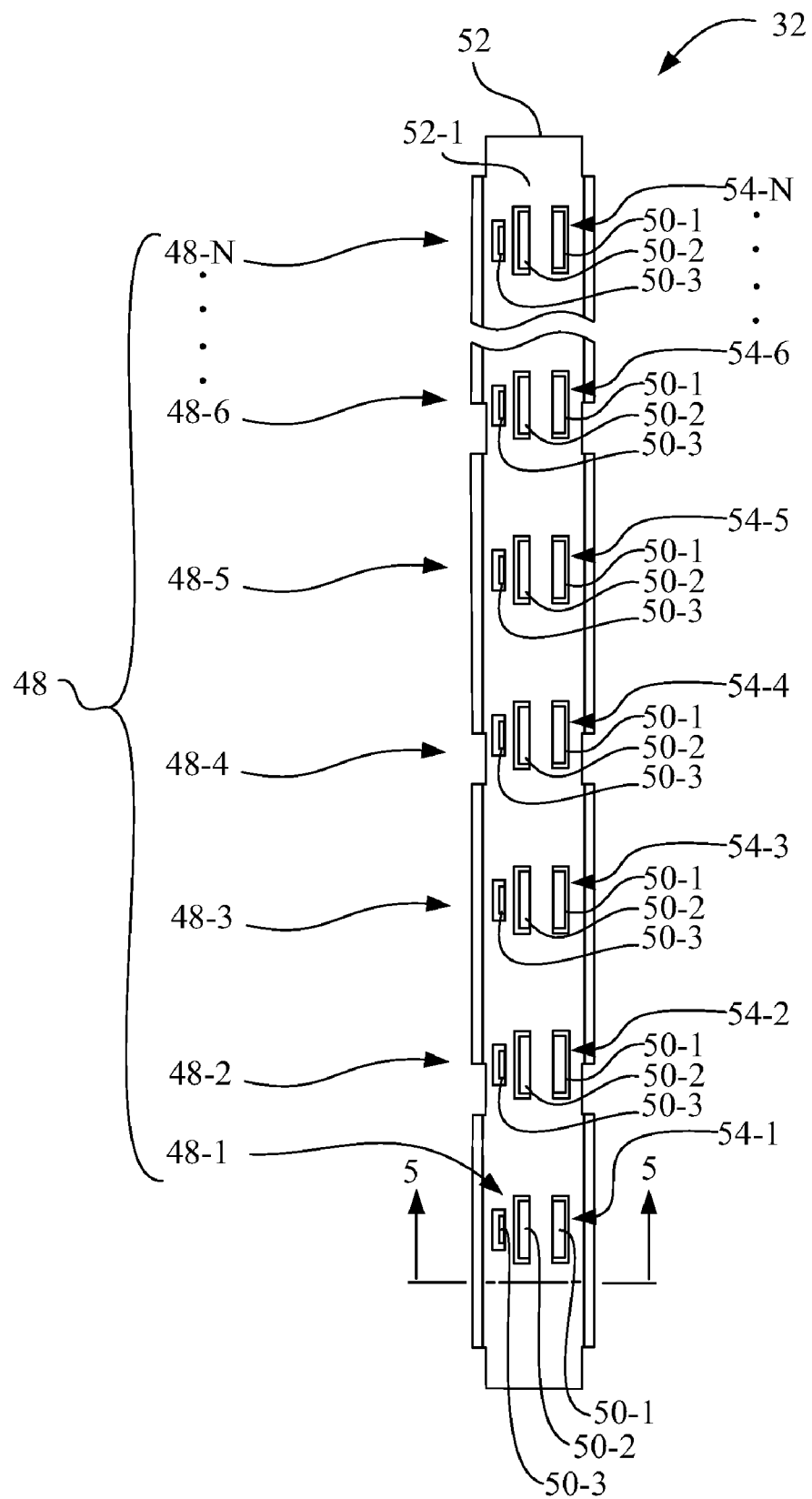
FIG. 4 is a front view of a power bus assembly of the power distribution system of FIG. 2.
Figure 5:
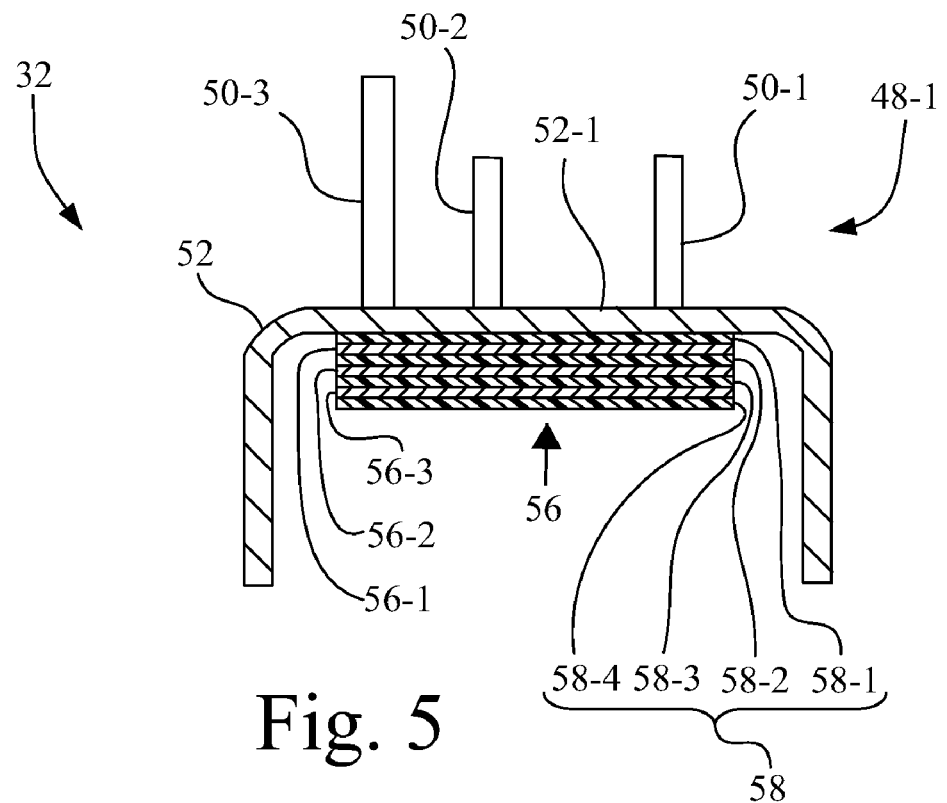
FIG. 5 is a section view of the power bus assembly of FIG. 4 taken along line 5-5.

Referring to FIGS. 2, 4 and 5, power bus assembly 32 has a plurality of sets of power bus connectors 48, individually identified in FIG. 4 as the set of power bus connectors 48-1, 48-2, 48-3, 48-4, 48-5, 48-6, . . . 48-N. Each set of power bus connectors 48-1, 48-2, 48-3, 48-4, 48-5, 48-6, . . . 48-N of the plurality of sets of power bus connectors 48 is located to be mechanically engaged by a corresponding set of power connectors 42 of a corresponding power electronics module 30-1, 30-2, 30-3, 30-4, . . . 30-N of the plurality of power electronics modules 30 when the corresponding power electronics module is installed in the module rack 28. Each set of power bus connectors 48-1, 48-2, 48-3, 48-4, 48-5, 48-6, . . . 48-N of the plurality of sets of power bus connectors 48 may be, for example, in the form of a set of electrically conductive blades (i.e., male connectors).

Each set of power bus connectors 48-1, 48-2, 48-3, 48-4, 48-5, 48-6, . . . 48-N of plurality of sets of power bus connectors 48 may include, for example, a positive power bus connector 50-1, a negative power bus connector 50-2, and a ground power bus connector 50-3. Positive power bus connector 50-1, negative power bus connector 50-2, and ground power bus connector 50-3 of each of the plurality of sets of power bus connectors 48 is configured and positioned for respectively engaging a corresponding positive connector 42-1, negative connector 42-2, and ground connector 42-3 of the respective corresponding power electronics module of the plurality of power electronics modules 30.

Using the set of power bus connectors 48-1 of power bus assembly 32 and power electronics module 30-1 as a more specific example, positive power bus connector 50-1, negative power bus connector 50-2, and ground power bus connector 50-3 are configured and positioned for respectively engaging the corresponding positive connector 42-1, negative connector 42-2, and ground connector 42-3 of power electronics module 30-1 (see FIG. 3). Ground connector 50-3 may also serve as a mechanical guide device to guide power electronics module 30-1 into its proper position with respect to power bus assembly 32 during installation of power electronics module 30-1 in module rack 28 by engaging ground connector (guide device) 42-3 of power electronics module 30-1.

As shown FIGS. 4 and 5, power bus assembly 32 includes an elongate structural member 52 having a smooth planar surface 52-1 and having a plurality of sets of openings 54-1, 54-2, 54-3, 54-4, 54-5, 54-6 . . . 54-N through which the sets of power bus connectors 48-1, 48-2, 48-3, 48-4, 48-5, 48-6, . . . 48-N of the plurality of sets of power bus connectors 48, e.g., blades, respectively extend. The smooth planar surface 52-1 of structural member 52 surrounds each set of power bus connector blades 48-1, 48-2, 48-3, 48-4, . . . 48-N of the plurality of sets of power bus connectors 48, and surrounds each power bus connector blade 50-1, 50-2, 50-3 of each set of power bus connector blades 48-1, 48-2, 48-3, 48-4, . . . 48-N.

As best illustrated in FIG. 5, power bus assembly 32 is configured in a low inductance configuration, so as to minimize the amount of capacitance per each of the power electronics modules 30. Power bus assembly 32 includes a plurality of power bus bars 56 arranged in parallel, which in the present example includes a positive power bus bar 56-1, a negative power bus bar 56-2 and a ground power bus bar 56-3 which are mounted to structural member 52. Each power bus bar 56-1, 56-2, 56-3 is constructed from a conductive material, e.g., metal, such as for example, copper, aluminum, silver plated nickel, etc. The plurality of power bus bars 56 when combined includes the plurality of sets of power bus connectors 48. More particularly, for example, positive power bus bar 56-1 has formed integral therewith positive power bus connectors 50-1, negative power bus bar 56-2 has formed integral therewith negative power bus connectors 50-2, and ground power bus bar 56-3 has formed integral therewith ground power bus connectors 50-3.

In the present example, referring to FIG. 5, a plurality of electrical insulator layers 58, including individual insulator layers 58-1, 58-2, 58-3, and 58-4, provide electrical insulation for the power bus bars 56, with a portion of the plurality of electrical insulator layers 58 being alternatingly interposed between the plurality of power bus bars 56. Each insulator layer 58-1, 58-2, 58-3, and 58-4 may be formed by a single layer of insulator material, such as Nomex® brand fiber from E. I. du Pont de Nemours and Company, or by a plurality of sub-layers of insulator material.

Insulator layer 58-1 is positioned between structural member 52 and the plurality of power bus bars 56. Insulator layer 58-2 is interposed between adjacent positive power bus bar 56-1 and negative power bus bar 56-2, and insulator layer 58-3 is interposed between adjacent negative power bus bar 56-2 and ground power bus bar 56-3. Insulator layer 58-4 is placed on the back side of ground power bus bar 56-3.

Figure 6:
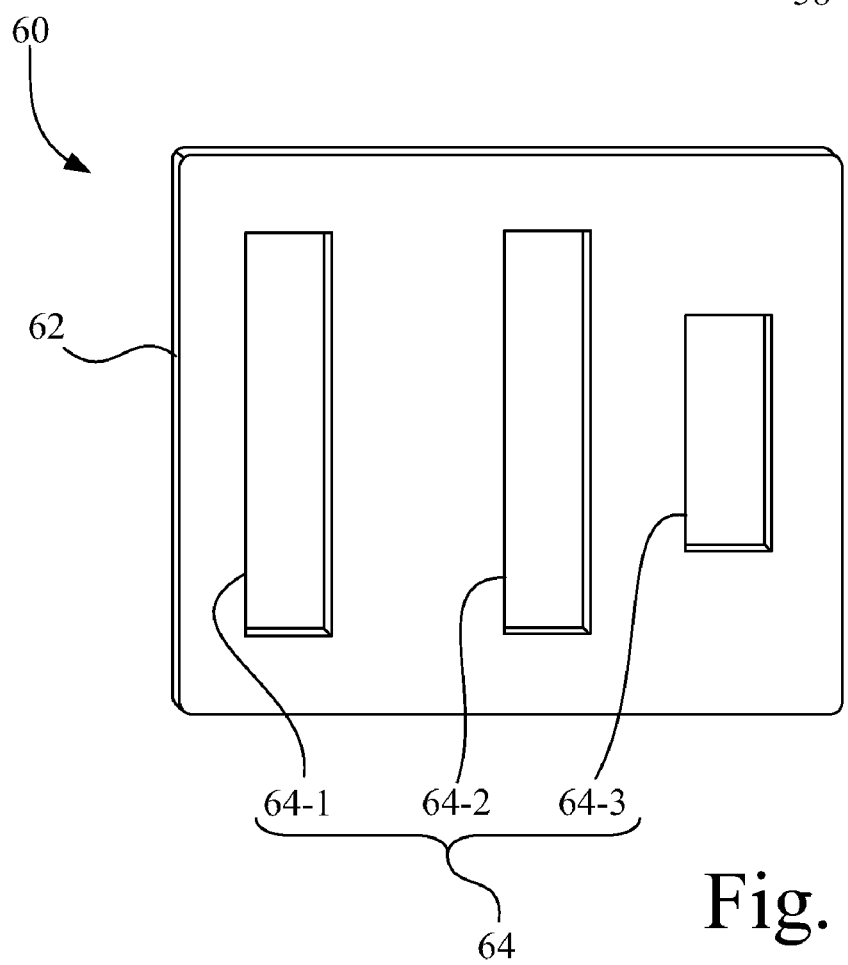
FIG. 6 is a perspective view of a gasket configured for being interposed between the power electronics module of FIG. 3 and the power bus assembly of FIG. 4.

Referring now also to FIG. 6 in relation to FIGS. 2-5, with respect to each power electronics module of the plurality of power electronics modules 30, there is a single gasket 60 interposed in a sealing arrangement between each power electronics module, e.g., power electronics module 30-1, and power bus assembly 32. The sealing arrangement provided by gasket 60 prevents contamination from dirt or fluids from causing positive to negative shorts, or bus to chassis shorts. By example, gasket 60 is configured to extend completely around all power connectors 42-1, 42-2, 42-3 of the set of power connectors 42 of a corresponding power electronics module, e.g., 30-1, and is configured to extend completely around each individual power connector 42-1, 42-2, and 42-3 of the set of power connectors 42, in a plane that intersects the set of power connectors 42. Likewise, gasket 60 is located to engage the smooth planar surface 52-1 of structural member 52 of power bus assembly 32. Each gasket 60 is configured to extend completely around all power bus connectors 50-1, 50-2, 50-3 of a corresponding set of power bus connectors, e.g., 48-1 of power bus assembly 32 and to extend completely around each individual power bus connector 50-1, 50-2, 50-3 of the set of power bus connectors 48-1, in a plane that intersects the corresponding set of power bus connectors, e.g., 48-1.

Gasket 60 is constructed as a one-piece planar member 62 formed from a material that is electrically non-conductive, resilient, and waterproof, such as for example, rubber, silicon, urethane foam, etc. Gasket 60 is constructed having a set of holes 64, which are individually identified in the present example as holes 64-1, 64-2, and 64-3. The set of holes 64 are sized and positioned in gasket 60 to correspondingly receive through the set of holes 64 the corresponding set of power connectors 42 of the corresponding power electronics module, e.g., 30-1, and receive the corresponding set of power bus connectors, e.g., 48-1, of power bus assembly 32.

In embodiments including a guide device, such as the guide device provided by ground connector 42-3 and ground power bus connector 50-3, or some other guide device, the gasket 60 is configured to extend completely around the guide device, as well as the respective electrical connectors.

Figure 7:
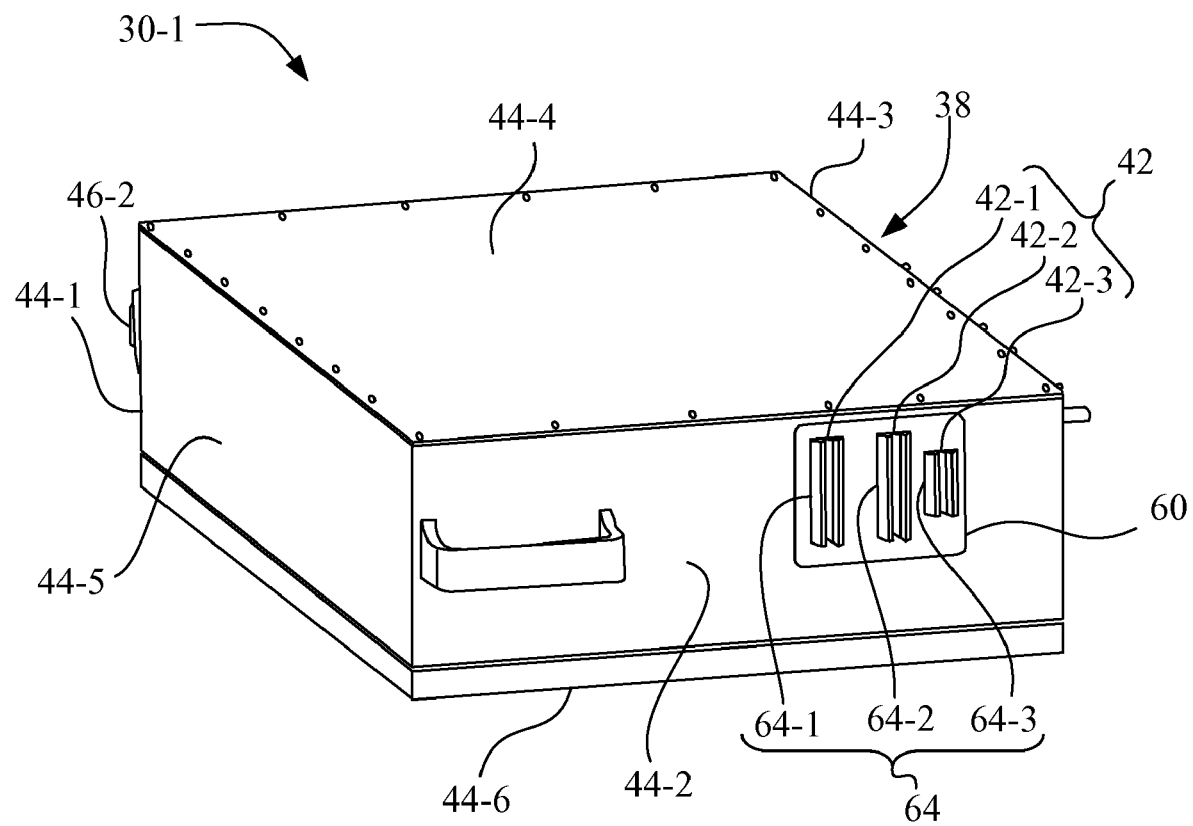
FIG. 7 is an embodiment showing the gasket of FIG. 6 installed on the power electronics module of FIG. 3.

In the embodiment shown in FIG. 7, a single gasket 60 is installed on power electronics module 30-1 over the set of power connectors 42, with set of holes 64 located to correspondingly receive the set of power connectors 42 through the set of holes 64. Gasket 60 may be attached, for example, by an adhesive to rear panel 44-2 of housing 38 of power electronics module 30-1. Alternatively, gasket 60 may be attached to power electronics module 30-1 by a compressive engagement of the set of holes 64 with the set of power connectors 42.

Figure 8:
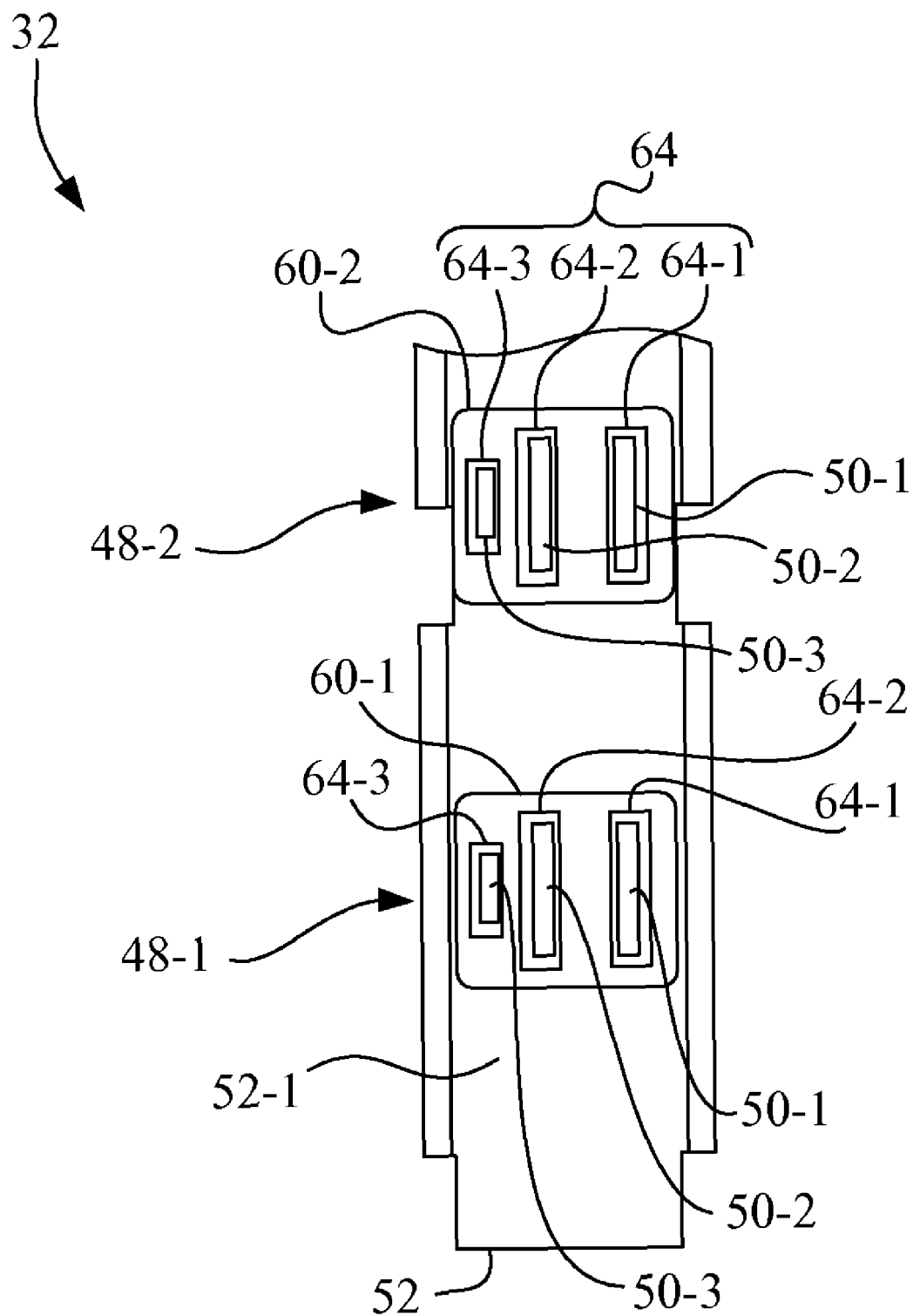
FIG. 8 is an embodiment of a portion of the power bus assembly of FIG. 4 showing a gasket of the type shown in FIG. 6 installed on each of the sets of power bus connectors.

In the embodiment shown in FIG. 8, each individual gasket 60, e.g., gaskets 60-1, 60-2, etc., as shown, is installed over a corresponding set of set of power bus connectors (e.g., connector blades) 48-1, 48-2, etc. of the plurality of sets of power bus connectors 48 of power bus assembly 32, with set of holes 64 located to correspondingly receive the power bus connectors 50-1, 50-2, 50-3 of the corresponding set of power bus connectors 48-1, 48-2, etc. through the set of holes 64. Gaskets 60-1 and 60-2, etc. may be attached, for example, by an adhesive to smooth planar surface 52-1 of structural member 52 of power bus assembly 32. Alternatively, gaskets 60-1, 60-2, etc. may be attached to power bus assembly 32 by a compressive engagement of the set of holes 64 with the corresponding set of set of power bus connectors 48-1, 48-2, etc.

Thus, with respect to power distribution system 14 having a plurality of power electronics modules 30 installed and secured therein, a plurality of the individual gaskets 60 are respectively interposed in a sealing arrangement between the plurality of power electronics modules 30 and the power bus assembly 32 to prevent contaminants from forming short circuits between the various connectors and buses.

Having described the preferred embodiment, it will become apparent that various modifications can be made without departing from the scope of the invention as defined in the accompanying claims.

The invention claimed is:

1. A power distribution system for a work machine, comprising:
    a plurality of power electronics modules, each said power electronics module of said plurality of power electronics modules having a set of power connectors to receive electrical power;
    a module rack having a plurality of openings for respectively slidably receiving said power electronics modules;
    a power bus assembly mounted to said module rack, said power bus assembly having a structural member with a smooth planar surface substantially in a common plane and having a plurality of spaced openings, and a plurality of sets of power bus connectors located to be mechanically engaged by a corresponding set of power connectors of a corresponding power electronics module of said plurality of power electronics modules along the common planar surface when said power electronics module is installed in said module rack, each of the sets of power bus connectors passing through a corresponding set of the spaced openings; and
    a plurality of gaskets, each individual gasket of said plurality of gaskets being mounted on the common planar surface and interposed in a sealing arrangement between said corresponding power electronics module and said power bus assembly, said each individual gasket being configured to extend completely around corresponding power electronics module of said plurality of power electronics modules and configured to extend completely around each individual power connector of said corresponding set of power connectors of said corresponding power electronics module.

2. The power distribution system of claim 1, wherein said gasket extends completely around all power bus connectors said set of power bus connectors and extends completely around each individual power bus connector of said set of power bus connectors.

3. The power distribution system of claim 1, wherein said gasket is constructed as a one-piece planar member formed from a material that is electrically non-conductive and is resilient.

4. The power distribution system of claim 1, wherein said gasket is installed on one of said power electronics module over said set of power connectors and said power bus assembly over said set of power bus connectors.

5. The power distribution system of claim 4, wherein said gasket is constructed as a planar member having a set of holes sized and positioned to receive said set of power connectors and said set of power bus connectors through said set of holes.

6. The power distribution system of claim 1, wherein said power electronics module has a first guide device adjacent a power connector of said set of power connectors, and said power bus assembly has a second guide device to engage said first guide device in a guiding arrangement, said gasket being configured to extend completely around said first guide device and said second guide device when said first guide device is engaged with said second guide device.

7. The power distribution system of claim 1, wherein said power bus assembly has a smooth planar surface that surrounds said set of power bus connectors and surrounds each power bus connector of said set of power bus connectors, said gasket being sized and positioned to engage said smooth planar surface around said set of power bus connectors, and being located to engage said smooth planar surface around each power bus connector of said set of power bus connectors, in forming said sealing arrangement between said power electronics module and said power bus assembly.

8. The power distribution system of claim 1, further comprising a clamping mechanism to securely couple said power electronics module to said power bus assembly.

9. A work machine; comprising;
    an electrical power source;
    a plurality of traction motors; and
    a power distribution system coupled between said electrical power source and said plurality of traction motors, including:
    a plurality of power electronics modules, each power electronics module of said plurality of power electronics modules having a set of power connectors to receive electrical power;
    a module rack having a plurality of openings for respectively slidably receiving said plurality of power electronics modules;
    a power bus assembly mounted to said module rack, said power bus assembly having a structural member with a smooth planar surface substantially in a common plane and having a plurality of spaced openings, and a plurality of sets of power bus connectors, each set of power bus connectors being located to be mechanically engaged by a corresponding set of power connectors of a corresponding power electronics module of said plurality of power electronics modules along the common planar surface when said corresponding power electronics module is installed in said module rack, each of the sets of power bus connectors passing through a corresponding set of the spaced openings; and
    a plurality of gaskets, said plurality of gaskets being mounted on the common planar surface and interposed in a sealing arrangement between said plurality of power electronics modules and said power bus assembly, wherein a corresponding gasket of said plurality of gaskets is configured to extend completely around said corresponding set of power connectors of said corresponding power electronics module and is configured to extend completely around each individual power connector of said corresponding set of power connectors of said corresponding power electronics module.

10. The work machine of claim 9, wherein said corresponding gasket extends completely around a corresponding set of power bus connectors that corresponds to said corresponding power electronics module and extends completely around each power bus connector of said corresponding set of power bus connectors.

11. The work machine of claim 9, wherein each gasket of said plurality of gaskets is constructed as a one-piece planar member formed from a material that is electrically non-conductive and is resilient.

12. The work machine of claim 9, wherein said corresponding gasket is installed on said corresponding power electronics module over said corresponding set of power connectors.

13. The work machine of claim 9, wherein said corresponding gasket is constructed as a planar member having a set of holes sized and positioned to correspondingly receive said corresponding set of power connectors through said set of holes.

14. The work machine of claim 9, wherein said corresponding power electronics module has a first guide device located adjacent a power connector of said corresponding set of power connectors, and said power bus assembly has a second guide device to engage said first guide device in a guiding arrangement, said corresponding gasket being further configured to extend completely around said first guide device and said second guide device when said first guide device is engaged with said second guide device.

15. The work machine of claim 9, wherein said power bus assembly has a smooth planar surface that surrounds said set of power bus connectors and surrounds each power bus connector of said set of power bus connectors, said gasket being sized and positioned to engage said smooth planar surface around said set of power bus connectors and located to engage said smooth planar surface around each power bus connector of said set of power bus connectors in forming said sealing arrangement between said power electronics module and said power bus assembly.

16. A power bus assembly for use in a power distribution system, comprising:
  a structural member having a smooth planar surface substantially in a common plane and having a plurality of sets of spaced openings;
  a first power bus bar and a second power bus bar mounted to said structural member, said first power bus bar having a plurality of first connector blades, said second power bus bar having a plurality of second connector blades, each of said first connector blades extends through a first opening of each of said sets of spaced openings; each of said second connector blades extends through a second opening of each of said sets of spaced openings, wherein said smooth planar surface surrounds each set of said first and second connector blades of said plurality of sets of said first and second connector blades, and surrounds each of said first connector blade and said second connector blade of each set of said first and second connector blades;
  a plurality of insulator layers, wherein a first insulation layer of said plurality of insulator layers is interposed between said first power bus bar and said second power bus bar, and a second insulator layer of said plurality of insulator layers being interposed between said structural member and one of said first power bus bar and said second power bus bar; and
  a plurality of individual gaskets, wherein each gasket of said plurality of individual gaskets is respectively positioned on the common planar surface over a corresponding set of said first and second connector blades of said plurality of sets of said first and second connector blades, and is located to engage said smooth common planar surface and extend completely around said corresponding said set of said first and second connector blades, and is located to engage said smooth planar surface and extend completely around each of said first connector blade and said second connector blade of said corresponding set of said first and second connector blades.

17. The power bus assembly of claim 16, wherein said each gasket is attached to said smooth planar surface of said structural member, and is constructed as a one-piece planar member formed from a material that is electrically non-conductive and is resilient.

18. The power bus assembly of claim 16, wherein said each gasket is constructed as a planar member having a set of holes sized and positioned to correspondingly receive said corresponding set of said first and second connector blades through said set of holes.

\* \* \* \* \*